Nov. 3, 1964 J. W. HIGGINBOTHAM 3,155,915

THERMAL MODULATION FOR TRANSISTOR DRIFT CORRECTION

Filed June 28, 1962 2 Sheets-Sheet 1

INVENTOR.
JOHN W. HIGGINBOTHAM

BY Sughrue, Rothwell, Mion, and Zinn

ATTORNEYS.

INVENTOR.
JOHN W. HIGGINBOTHAM
BY
Sughrue, Rothwell, Mion, and Zinn
ATTORNEYS.

United States Patent Office 3,155,915
Patented Nov. 3, 1964

3,155,915

THERMAL MODULATION FOR TRANSISTOR DRIFT CORRECTION

John W. Higginbotham, Bel Air, Md., assignor to Martin-Marietta Corporation

Filed June 28, 1962, Ser. No. 206,098
3 Claims. (Cl. 330—10)

This invention relates to electrical circuits which utilize semi-conductor devices for amplifying and translating purposes, and in particular to a method and means for stabilizing such circuits against temperature induced variations.

Although transistors are quite suitable for use in most applications, such devices are highly temperature sensitive. Thus, variations in the ambient temperature as well as variations due to power dissipation within the transistors themselves may prove to be a critical consideration in certain situations. Utilization of transistors in D.C. amplifiers is predominantly limited by variation of collector leakage current and threshold voltage with junction temperature. Prior art circuits have reduced the effect of threshold voltage variation by connecting a high input resistor to the transistor base. Also, the effect of the voltage-sensitive component of leakage can be reduced by operating the transistor at a low collector voltage into a short circuit load with negligible collector power dissipation. Further improvement of drift characteristics can be realized only by close temperature control.

Presently known techniques employed to compensate for changes in collector leakage current also include tracking with various devices having similar temperature characteristics such as thermistors, diodes, silicon resistors, and another similar transistor. All these devices show the same limitation in that they must be selected to match the transistor leakage temperature curve and packaged so that they have a temperature identical to the transistor they are compensating. Such compensation methods are difficult and always subject to some error.

Another approach to the problem of eliminating drift in transistorized D.C. amplifier circuits has been the use of modulating techniques. A low-level D.C. input signal is first modulated by an A.C. signal, whereafter the resultant signal is amplified in a conventional amplifier and the carrier is then removed. It has also been proposed to utilize a Hall effect modulator for converting variable direct current voltages into modulated or alternating current for amplification purposes.

Other modulating techniques include a feedback circuit to change the output signal by the same magnitude but in opposite polarity to the change in the drift leakage current. The prior techniques have all had one feature in common in that they modulate external to the D.C. amplifying device itself and consequently produce an amplified output signal consisting of the D.C. signal plus a component of the modulating signal and the drift.

Accordingly, it is an important object of the present invention to provide an improved compensated transistor amplifier utilizing thermal modulation techniques.

It is another object of the present invention to provide an improved semiconductor structure particularly suitable for use in thermal modulation circuits.

Another object of this invention is the provision of an improved D.C. amplifier which is drift free in operation.

Another object of this invention is the provision of an electronic device for the measurement of small D.C. potentials which is both stable and efficient in operation.

Still another object of this invention is the provision of an improved semiconductor signal conveying circuit wherein means are provided for stabilizing the circuit against temperature variations.

It is another object of the present invention to provide an improved signal amplifying circuit utilizing a novel semiconductor member to provide stabilization of low level, ultra-low drift signals.

These and further objects and advantages are achieved in the present invention by utilizing a novel semiconductor device in the form of a modified front end transistor which may be stabilized against undesirable drift in the collector current by thermally modulating the transistor at its collector junction where the error signal is generated. The variations in temperature produce an A.C. output whose amplitude is a measure of the drift current at any temperature. The A.C. signal and its superimposed drift component are rectified and degeneratively fed back to the transistor to compensate for drift leakage current.

The novel features that are considered characteristic of this invention are set forth with particularity in the appended claims. The invention itself, however, will best be understood from the following description when read in connection with the accompanying drawings, in which:

Figure 3:
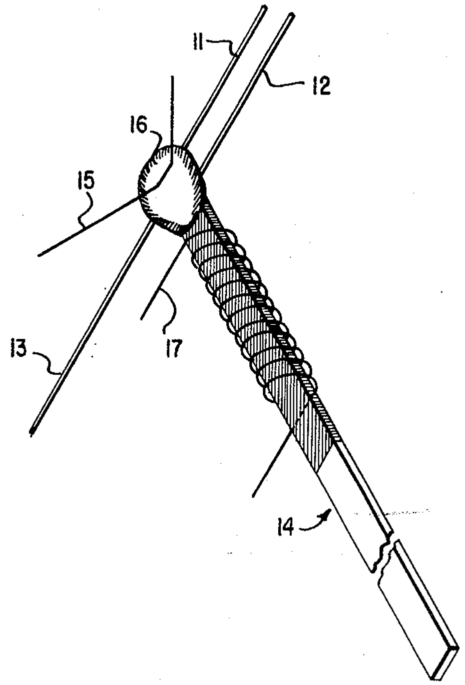

FIGURE 3 discloses a preferred embodiment of the applicant's invention; and

Figure 4:
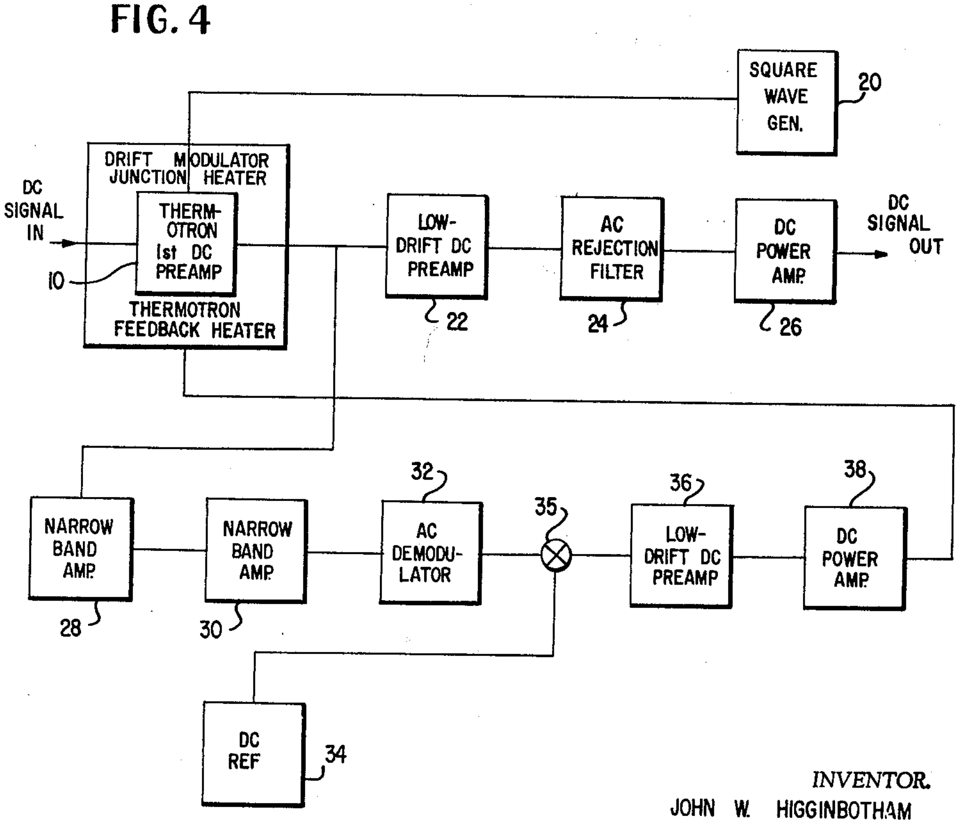

FIGURE 4 is a schematic representation illustrative of a specific embodiment of a controlled D.C. amplifier system in accordance with this invention.

Figure 1:
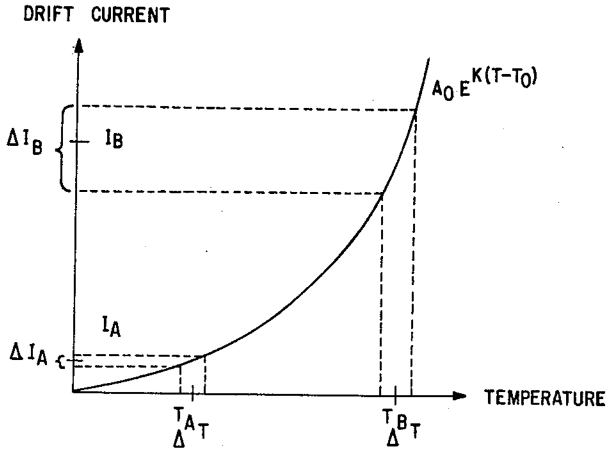
FIGURE 1 is a graphical representation of the drift current versus its causitive independent variable temperature.

FIGURE 1 discloses the experimental relationship found to exist between the leakage (drift) current and its causitive independent variable temperature. From the graph it is clear that the collector leakage current is very sensitive to variations in temperature. Thus, if the ambient temperature is $T_A$, a corresponding leakage current $I_A$ exists. If the temperature is varied by an amount $\Delta T$, a change in leakage $\Delta I_A$ will exist. Similar considerations hold for the complete range of temperature so that an increase in temperature $\Delta T$ at $T_B$ will result in a corresponding increase in current $\Delta I_B$. It can be shown that if the junction of a conducting D.C. amplifier were to be very rapidly heated and cooled, a sinusoidal signal representation would appear in the output. This signal would be superimposed on the normally amplified D.C. signal and both signals would include a component due to the inherent leakage or drift current. Upon separation the output signal yields two components: an A.C. component consisting of a portion due to the modulating signal and a drift component, and also a D.C. signal which is a function of the input and leakage.

Inasmuch as the A.C. component contains none of the D.C. input signal, a superior correction signal may be realized since the modulated drift now contains less modulated input signal than modulated signal contains modulated drift signal. Thus, if the A.C. component is amplified and demodulated, there results a D.C. component which is a function of constants and also the variable drift or leakage current. This signal may then be returned to the amplifier input terminals in a manner such that it cancels any drift induced error signals while allowing the D.C. input signal to be amplified normally. This broad modulating scheme and in particular the apparatus for effecting it forms the specific features of interest of this invention.

Figure 2:
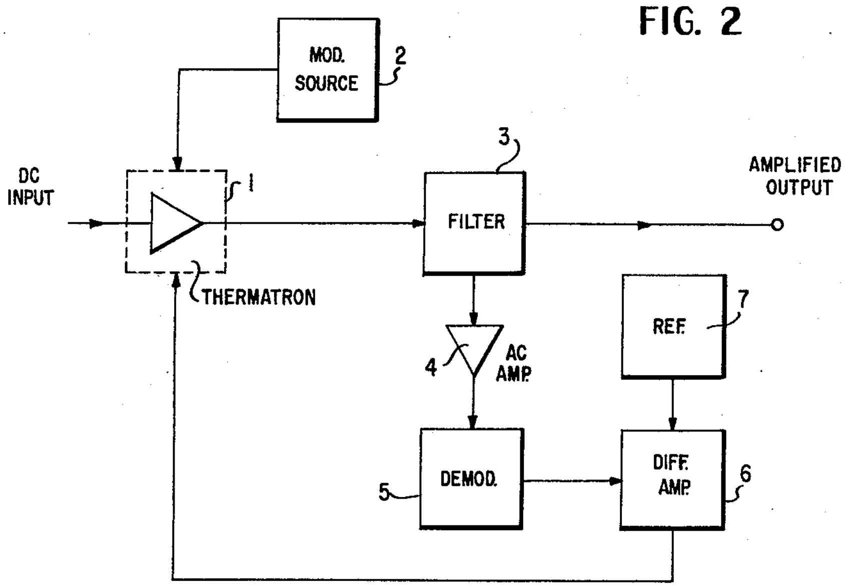
FIGURE 2 shows in block diagram form a D.C. amplifier system embodying applicant's invention.

Referring now to the embodiment of FIGURE 2, this invention provides a novel semiconductor device 1 referred to as a thermatron which includes a modified front end transistor thermally modulated by a stabilized A.C. source 2. The thermatron 1 with its modulating source 2 are shown here as embodied in a system including a conventional filter network 3 which separates the output signal into its A.C. and D.C. components. The A.C. component of the output signal passes through amplifier 4 after which it is demodulated or rectified in member 5. This signal is then compared by means of a difference amplifier 6 to a reference 7 representing the desired value of $Ic_0$. The difference signal is fed back to the thermatron so that the output signal will be stabilized against the drift induced error signals.

The thermatron as shown in FIGURE 3 may be constructed by modifying existing transistors of preferred characteristics. The modified transistor of FIGURE 3 consists of the transistor element of a standard mesa transistor mounted on a thin tab so as to form an ultra-miniature silicon transistor. The transistor utilizes base leads 11 and 12, emitter lead 13, and a collector tab 14.

The thermatron also includes a cooperating electrode 15 in the form of a heater element consisting of a portion of a precision resistor. The heater element 15 is positioned within a recess in the transistor body, the unit being sealed with epoxy 16. This embodiment further includes a second heating element 17 in the form of a feedback temperature controller coil would around the collector tab 14 of the transistor. The feedback temperature controller ensures that the junction temperature will be driven to and held at the temperatures that makes $Ic_0$ constant with respect to the reference signal.

Since temperature drift is very localized to the collector junction, it is quite important that the heater 15 be positioned so that only the collector junction is heated. This is as contrasted to some prior art devices in which heat is applied to the entire semiconductor structure.

Any limitations concerning the operation of the thermatron are band-pass in nature rather than due to drift correction ability. Thus, a necessary limitation concerns the time lag induced response frequency of the junction; i.e., the frequency with which the junction will respond to temperature changes. Inasmuch as the response frequency is a direct function of the transistor mass, the preferred embodiment of the thermatron utilizes a micro-miniature silicon transistor. By utilizing this unit, there results an extremely small thermatron which permits higher modulating frequencies. In addition to the increased response frequency, the decreased size of the transistor reduces the power required by the feedback temperature controller. The silicon structure is found desirable over the somewhat analogous germanium transistors, inasmuch as it is able to withstand appreciably greater temperature variations.

FIGURE 4 discloses the thermatron in conjunction with the elements of the control system which are utilized therewith. In this circuit configuration, the function of the thermatron 10 is threefold; i.e., it amplifies the D.C. input signal, it responds to the modulation signal from source 20 and amplifies the temperature induced modulating signal, as well as responding to the stabilizing voltage at the feedback controller coil associated with the thermatron. After amplification in the low-drift D.C. preamplifier 22, the A.C. and D.C. output portions are separated in the AC. rejection filter 24, whereafter the D.C. component is further amplified in the D.C. power amplifier portion 26.

The A.C. component is separated from the D.C. signal in the two narrow-band amplifier portions 28 and 30. This allows the demodulator 32 to operate directly on the modulating carrier and its drift component. The A.C. demodulator 32 detects the phase and amplitude of the A.C. heating modulating signal coupled with the drift signal so that it can be compared at point 35 with a signal from the D.C. reference source 34. The difference between the detected A.C. modulating signal with its drift component and the D.C. reference signal is the error developed within the thermatron. This signal is amplified in the two low-drift D.C. amplifiers 36 and 38, then returned to the feedback controlled coil associated with the thermatron where the heat generated is such that the demodulated A.C. component at point 35 is equal to the D.C. reference.

Inasmuch as the circuitry of the specific components utilized in conjunction with the thermatron as represented in the preferred embodiment do not constitute the subject of this invention, they are referred to only in a general sense, any suitable components being usable.

Although the above explanation indicates the use of a preferred thermatron construction being utilized to perform a leakage current correction in a D.C. amplifier system, the invention is not limited to this form nor this environment. In this respect, the method described can also correct temperature variations in transistor threshold voltages since it is also capable of thermal modulation.

In addition, the potential uses of the thermatron idea are quite large. Such uses might include: extremely accurate D.C. operational amplifiers, analog-to-digital converters, low-level D.C. voltmeters, true R.M.S A.C. voltmeters, and as a standard reference.

Structural modifications of the thermatron itself are contemplated, such modifications include the substitution of a thermal electric junction in place of the feedback temperature controller heater which would thereby provide the temperature controller with plus and minus control, instead of the present version of a heater which provides only positive control.

From the foregoing it should be apparent that the present invention is applicable to other uses and circuit arrangements, the ones illustrated being by way of example only. It should also be apparent that by provision of the present invention, stabilization of signal-conveying circuits employing transistors with temperature variations is easily and effectively accomplished.

While there have been shown and described and pointed out the fundamental novel features of the invention as applied to the preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. Apparatus to modulate a temperature sensitive amplifying device including a semiconductor member having an input and an output circuit, at least one cooperative electrode attached to said semiconductor member, thermal modulating means associated with said electrode to vary the current flow therethrough so as to provide an A.C. signal component at said output circuit differencing means included in said output circuit of said semiconductor member to separate a signal appearing at said output circuit into its D.C. and A.C. components, means to rectify the A.C. component, said rectified A.C. component being a function of the thermal characteristic of said semiconductor member and means to degeneratively feed back said rectified A.C. component to the input of said semiconductor member.

2. Apparatus to modulate a D.C. input signal comprising a first semiconductor amplifying device having an input and output circuit and including at least one cooperative electrode attached to said semiconductor, means including a varying voltage source to rapidly heat and cool said cooperating electrode, a filter network to separate the output signal of said first semiconductor device into A.C. and D.C. components, a second semiconductor device to amplify said A.C. component, a device to rectify said amplified A.C. component, and means to degeneratively return said rectified, amplified component to the input of said first amplifier.

3. A stabilized D.C. amplifier system comprising means to amplify a D.C. signal, said means being in the form of a semiconductor device having at least one collector junction, means in close proximity to said collector junction to thermally modulate said collector junction so as to generate an A.C. signal component at the output of said semiconductor device, said A.C. component consisting of said modulated signal and a leakage component due to temperature induced drift at the collector junction, said D.C. signal being amplified independently of said A.C. signal, means to separate said output signal into its A.C. and D.C. components, demodulating means to separate said drift component from the A.C. modulating signal, and means to degeneratively feed back the drift component to the input of said D.C. amplifier so as to stabilize the output signal against said temperature induced drift signal.

References Cited by the Examiner

UNITED STATES PATENTS

| | | | |
|---|---|---|---|
| 2,930,904 | 3/60 | Fritts | 307—88.5 |
| 2,941,153 | 1/60 | Merrill | 330—23 |
| 2,953,752 | 9/60 | Porter | 330—9 |
| 3,017,520 | 1/62 | Maupin | 330—23 |
| 3,017,522 | 1/62 | Lubcke | 307—88.5 |

BENNETT G. MILLER, *Primary Examiner.*

ROY LAKE, *Examiner.*